United States Patent [19]

Sekihara et al.

[11] Patent Number: 4,939,463
[45] Date of Patent: Jul. 3, 1990

[54] IMAGE RECONSTRUCTION METHOD IN NMR IMAGING

[75] Inventors: Kensuke Sekihara, Musashimurayama; Shigeru Matsui, Kodaira; Hideki Kohno, Tokyo, all of Japan

[73] Assignee: Hitachi, Ltd., Tokyo, Japan

[21] Appl. No.: 218,694

[22] Filed: Jul. 7, 1988

[30] Foreign Application Priority Data

Jul. 8, 1987 [JP] Japan .................................. 62-168644

[51] Int. Cl.$^5$ ............................................ G01R 33/20
[52] U.S. Cl. ................................................... 324/309
[58] Field of Search ......................... 324/300, 307, 309

[56] References Cited

U.S. PATENT DOCUMENTS

| 4,355,282 | 10/1982 | Young et al. | 324/309 |
| 4,588,948 | 5/1986 | Mansfield | 324/309 |
| 4,678,996 | 7/1987 | Haacke | 324/309 |
| 4,716,369 | 12/1987 | Sekihara | 324/309 |
| 4,733,188 | 3/1988 | Sekihara | 324/309 |

OTHER PUBLICATIONS

Magnetic Resonance in Medicine, vol. 2, 1985, pp. 203-217.

Journal of Magnetic Resonance, vol. 67, No. 3, May 1986, pp. 476-490.

Magnetic Resonance in Medicine, vol. 5, No. 5, Nov. 1987, pp. 485-491.

*Primary Examiner*—Michael J. Tokar
*Attorney, Agent, or Firm*—Antonelli, Terry, Stout & Kraus

[57] ABSTRACT

A method wherein the requirement for the amplitude of the oscillating gradient magnetic field is relaxed by reconstructing an image while using simultaneously echoes $S_p(k_x, y)$ produced in the case where the positive oscillating gradient magnetic field is applied to the object to be tested and echoes $S_N(k_x, y)$ produced in the case where the negative is applied thereto, i.e. by using data points on segments of a trajectory of data points ascending from left to right in the spatial frequency domain and those on segments of a trajectory of data points ascending from right to left. That is, the image $M(x, y)$ is obtained by Fourier-transforming at first the echoes $S_p(k_x, k_y)$ and $S_N(k_x, k_y)$ with respect to $k_y$, multiplying complex numbers $a_1$ and $a_2$ to $g_p(k_x, y)$ and $g_N(k_x, y)$ obtained by this transformation; adding the results thus obtained, i.e. forming $g(k_x, y) = a_1 g_p(k_x, y) + a_2 g_N(k_x, y)$; and finally Fourier-transforming this $g(k_x, y)$ with respect to $k_x$.

7 Claims, 8 Drawing Sheets

IMAGE RECONSTRUCTION METHOD IN NMR IMAGING

BACKGROUND OF THE INVENTION

This invention relates to an image reconstruction method in nuclear magnetic resonance (NMR) imaging and in particular to an image reconstruction method in NMR imaging capable of realizing easily a high speed imaging by reducing the amplitude and the frequency of the oscillating gradient magnetic field used by the echo planar method by 50%.

The echo planar method is described in J. Phys. C: Solid State Physics 10, L55-8 (1977). By this method the following relationship;

$$G_x = 2MG_y \quad (1)$$

where M represents the size of an image matrix, is valid between the amplitude $G_x$ of the oscillating gradient magnetic field and the amplitude $G_y$ of the gradient magnetic field stationarily applied. (Here it is assumed that M×M pixels are contained in an image matrix.) Further it is assumed here that the sizes of the form of the field of view and that of a pixel are equal in the x and y directions are equal to each other.

It is said that $G_y$ should be usually about $2 \times 10^{-3}$ T/m. Therefore, assuming M=128, $G_x=5.12\times 10^{-1}$ Wb/m³. In practice it is almost impossible to drive a gradient magnetic field having such a great amplitude.

On the other hand, in order to overcome this difficulty as described above, a method called fast Fourier imaging has been proposed in Magnetic Resonance in Medicine Vol. 2, pp. 203–217 (1985).

Using the echo planar method it is possible in principle to reconstruct an image by a single signal measurement succeeding an application of a 90° pulse. On the other hand, in order to implement the Fourier imaging method M measurements are necessary. The fast Fourier imaging method provides a comprising method between the echo planar method and the Fourier imaging method. According to this method N measurements are necessary, N being given by $1 \leq N \leq M$. However the requirement for the amplitude of the gradient magnetic field, corresponding to Eq. (1), is alleviated to;

$$G_x = \frac{2M}{N} G_y. \quad (2)$$

Adopting N=32 in the above numerical example, $G_x = 1.6 \times 10^{-2}$ T/m. Even this value is fairly difficult to realize in practice. In order to reduce the required amplitude of the gradient magnetic field to a practical domain $G_x < 1 \times 10^{-2}$ T/m, N=64 should be adopted in this numerical example, which is reduced only to a half of the number of measurements of 128 necessitated by the Fourier imaging method.

SUMMARY OF THE INVENTION

The object of this invention is to provide an image reconstruction method capable of realizing easily a high speed imaging by reducing the amplitude and the frequency of the oscillating gradient magnetic field used by the echo planar method by 50%.

According to any image reconstruction method known heretofore used for the echo planer method and the fast Fourier imaging method the image reconstruction by combining separately echoes produced in the case where a positive greadient magnetic field is applied and those produced in the case where a negative gradient magnetic field is applied. According to this invention the requirement for the amplitude of the oscillating gradient magnetic field is relaxed further to 50% by reconstructing the image while using them simultaneously. That an amplitude of the gradient magnetic field given by:

$$G_x = \frac{M}{N} G_y \quad (2')$$

can be used, when the proposed method is applied to the fast Fourier imaging method.

The principle of this invention can be explained as follows by using an analysis in the spatial frequency domain.

FIG. 2A indicates a trajectory of data points, in the case where measurements are effected according to the prior art echo planar method. The trajectory is represented by a zig-zag line as indicated in the figure, where $k_x$ and $k_y$ represent spatial angular frequencies in the x- and y-directions, respectively. According to the prior art image reconstruction method these data points on this trajectory were divided into data points on segments ascending from left to right, as indicated in FIG. 2B, and those on segments ascending from right to left, as indicated in FIG. 2C, which were Fourier-transformed separately. In this case the interval $\Delta k_y$ in the data grid in the $k_y$ direction is given by:

$$\Delta k_y = \gamma G_y (4 T_w) \quad (3)$$

where $4 T_w$ represents a period of the oscillating gradient magnetic field. Here the width $L_y$ of the field of view in the y-direction is given by:

$$L_y = \frac{2\pi}{\Delta k_y} \quad (4)$$

On the other hand, since there is a relationship;

$$P = \frac{2\pi}{\gamma G_x (2T_w)} \quad (5)$$

where P represents the size of a pixel, finally the following relationship should be satisfied;

$$G_x = 2 \frac{L_y}{P} G_y = 2 MG_y \quad (1)$$

This invention relates to a method for reconstructing images with a high precision, even in the case where the amplitude of the oscillating gradient magnetic field is reduced tro 50%, i.e. $G_x = MG_y$, by utilizing simultaneously data points on the segments ascending from left to right and those on the segments ascending from right to left.

In order to avoid complexity of mathematical treatments, the following explanations are given as a one-dimensional form.

Now it is assumed that $G_x = MG_y$ is satisfied. Fourier transformation in the $k_y$-direction for the zig-zag trajectory is considered. In FIG. 1A the data points on the segments ascending from left to right are indicated with white circlets and those on the segments ascending from right to left are indicated with black circlets. FIG. 1B represents the cross-section at a certain value of $k_x$ indicated by the broken line in FIG. 1A. Both the data points indicated by white circlets and those indicated by black circlets are arranged with a constant interval respectively, but two more closely adjacent data points belonging to the different groups are distant from each other by $\eta$.

When the data points indicated by white circlets are Fourier-transformed, since it is not $G_x=2MG_y$ but $G_x=MG_y$, which is a half of the former, that is selected for the value of $G_x$, $T_w$, which is twice as great as that required for the former, is necessary for ensuring the same pixel size, referring to Eq. (5). Consequently $\Delta k_y$ should be twice as great as that required originally, referring to Eq. (3).

Therefore the Fourier-transform of the data points indicated by white circlets can be represented by;

$$F_c(y) = F(y) + F\left(y - \frac{L_y}{2}\right) \quad (6)$$

for $0 \leq y \leq \frac{L_y}{4}$ and $$F_c(y) = F(y) + F\left(y + \frac{L_y}{2}\right) \quad (7)$$

for $0 > y \geq -\frac{L_y}{4}$, where $F(y)$ represents the Fourier-transform, in the case where $G_x=2MG_y$ is satisfied. This $F_c(y)$ is indicated in FIG. 3A. Since discrete Fourier transformation is applied, values are obtained only for $-L_y/4 \leq Y \leq L_y/4$.

On the other hand the Fourier-transform of the set of data indicated by black circlets can be represented by:

$$F_D(y) = \left\{ F(y) + F\left(y - \frac{L_y}{2}\right)e^{-i2\pi\xi} \right\} e^{iy\eta} \quad (8)$$

for $0 \leq y \leq L_y/4$ and $$F_D(y) = \left\{ F(y) + F\left(y - \frac{L_y}{2}\right)e^{i2\pi\xi} \right\} e^{iy\eta} \quad (9)$$

for $-L_y/4 \leq y < 0$ where
$\epsilon = \eta \Delta k y$.

Using Eqs. (6) and (8), the following relations can be obtained;

$$F(y) = \frac{-e^{-i2\pi\xi}}{1 - e^{-i2\pi\xi}} F_c(y) + \frac{e^{iy\eta}}{1 - e^{-i2\pi\xi}} F_D(y) \quad (10)$$

for $0 \leq y \leq \frac{L_x}{4}$ and $$F\left(y - \frac{L_y}{2}\right) = \frac{1}{1 - e^{-i2\pi\xi}} F_c(y) - \frac{e^{iy\eta}}{1 - e^{-i2\pi\xi}} F_D(y) \quad (11)$$

for $0 \leq y \leq \frac{L_y}{4}$.

Further, using Eqs. (7) and (9), $$F(y) = \frac{-e^{i2\pi\xi}}{1 - 2^{i2\pi\xi}} F_c(y) + \frac{e^{iy\eta}}{1 - e^{i2\pi\xi}} F_D(y) \quad (12)$$

for $0 \leq y \leq -\frac{L_x}{4}$ and $$F\left(y + \frac{L_y}{2}\right) = \frac{1}{1 - e^{i2\pi\xi}} F_c(y) - \frac{e^{iy\eta}}{1 - e^{i2\pi\xi}} F_D(y) \quad (13)$$

for $0 \leq y \leq -\frac{L_y}{4}$ can be obtained.

All the results of calculation using Eqs. (10) to (13) can be obtained only for $$-\frac{L_y}{4} \leq y \leq \frac{L_y}{4}.$$

However, since the real image $M(y)$ exists for $$-\frac{L_y}{2} \leq y \leq \frac{L_y}{2},$$

using $F(y)$, $$F\left(y - \frac{L_y}{2}\right) \text{and } F\left(y + \frac{L_y}{2}\right)$$

obtained for $$-\frac{L_y}{4} \leq y \leq \frac{L_y}{4}, M(y)$$

is synthesized for $$-\frac{L_y}{2} \leq y \leq \frac{L_y}{2}.$$

The result of this synthesis is indicated in FIG. 3B. Rearranging $F(y)$, $$F\left(y - \frac{L_y}{2}\right) \text{and } F\left(y + \frac{L_y}{2}\right)$$

thus obtained, as indicated in FIG. 10, it is possible to obtain $F(y)$, which is equal to the result of the discrete Fourier transform obtained in the case where the sampling interval in the $K_y$-direction satisfies the requirement of the sampling theorem.

Figure 4:
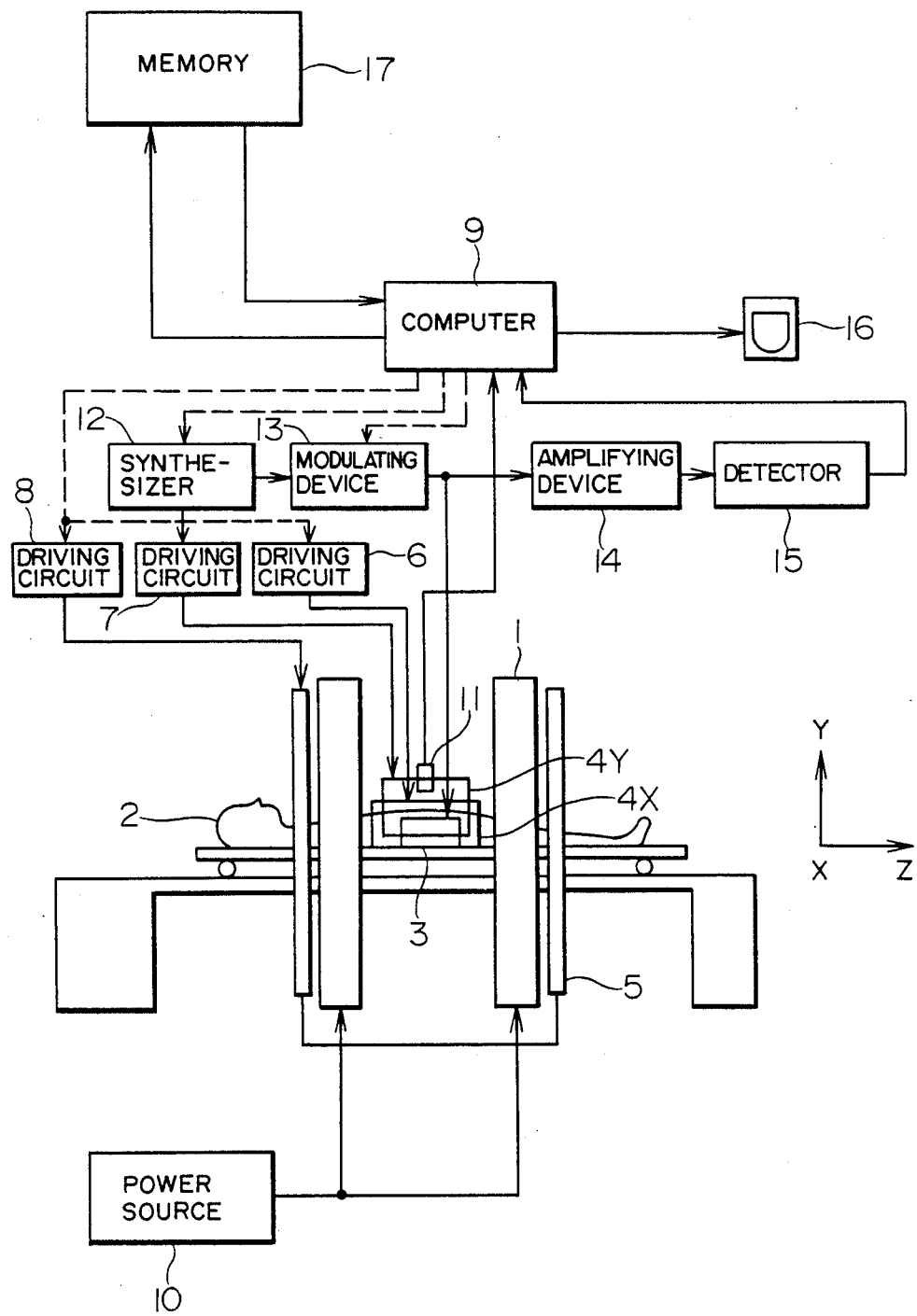
Figure 5:
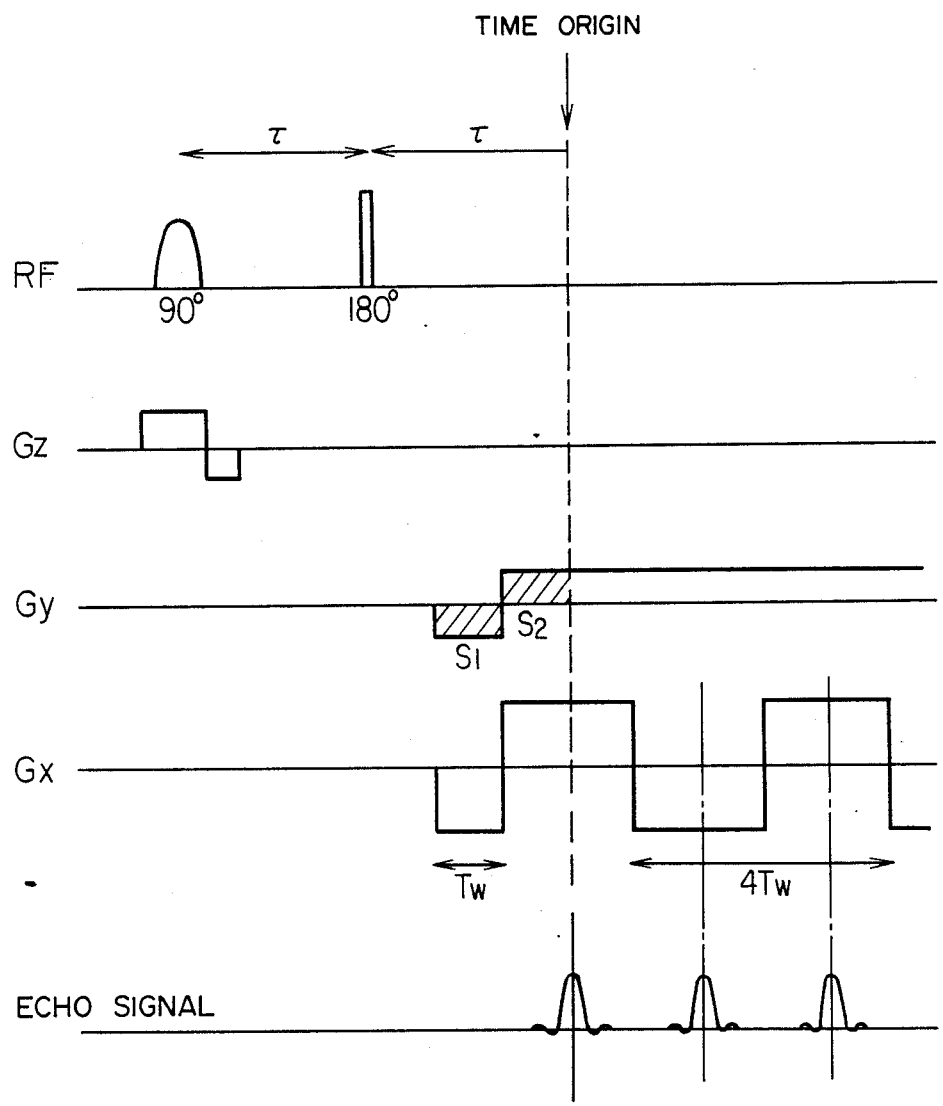
Figure 6:
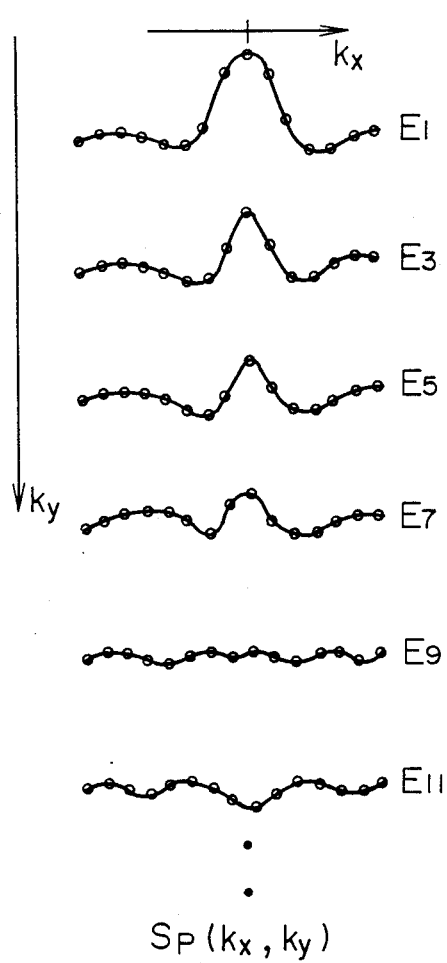
Figure 7:
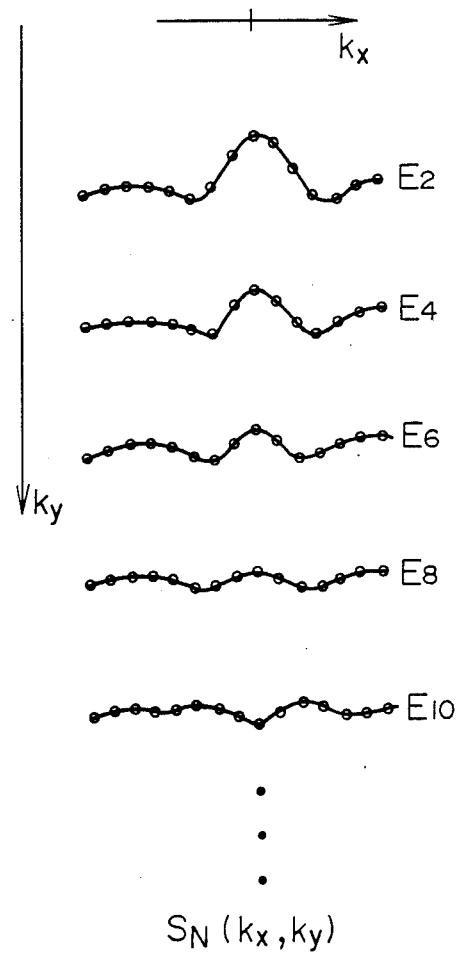
Figure 8:
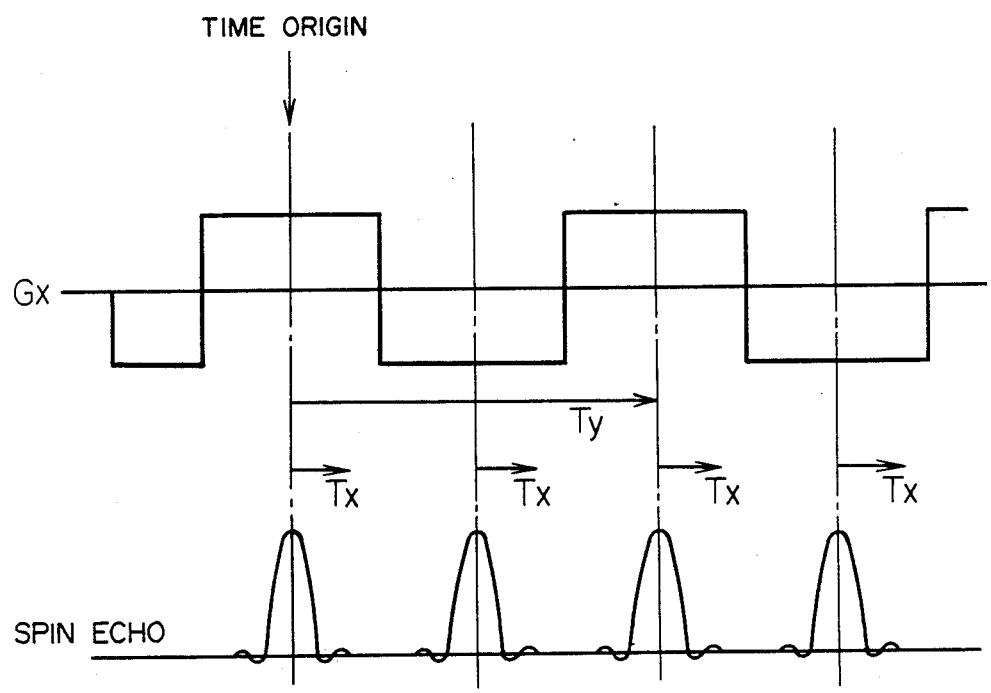

in the case where $\Delta k_y$ is twice as great as that required by the sampling theorem;

FIG. 4 illustrates an example of the construction of an NMR imaging device for realizing this invention;

FIG. 5 illustrates an example of the pulse sequence used for realizing the echo planar method;

FIG. 6 illustrates a 2-dimensional array constructed by odd-numbered echo groups;

FIG. 7 illustrates a 2-dimensional array constructed by even-numbered echo groups;

FIG. 8 is a scheme for explaining $T_x$ and $T_y$; and

Figure 9:
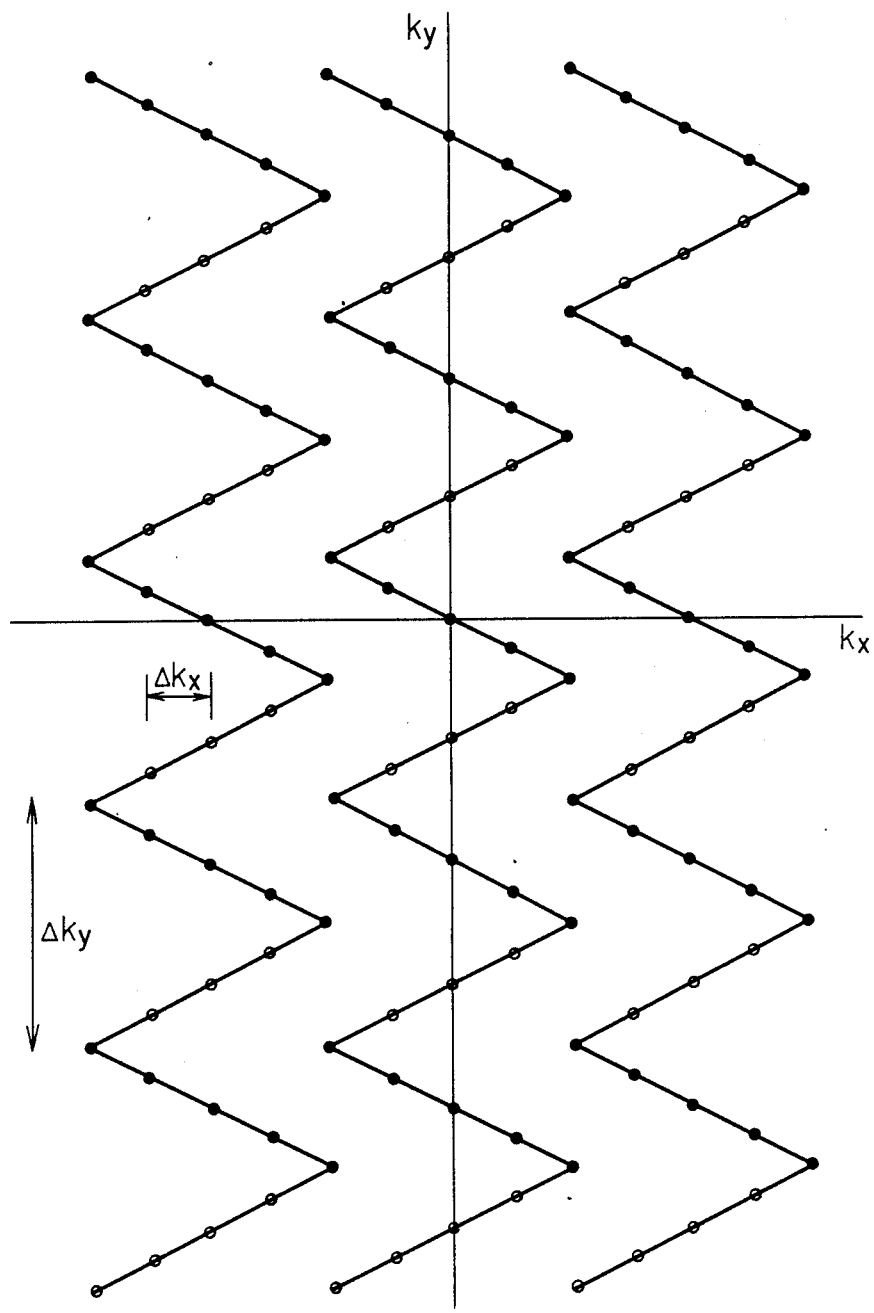

FIG. 9 indicates trajectories in a k-space of data points by the fast Fourier imaging method.

DESCRIPTION OF THE PREFERRED EMBODIMENTS

Hereinbelow an embodiment of this invention will be explained, referring to the drawings.

FIG. 4 is a scheme illustrating the construction of a testing device utilizing the nuclear magnetic resonance (hereinbelow called simply testing device) according to an embodiment of this invention.

In FIG. 4 reference numeral 1 is a pair of electromagnets generating a static magnetic field $H_O$; 2 is an object body; 3 is a coil generating a high frequency magnetic field and at the same time detecting signals produced by the object body 2; $4_x$, $4_y$ and 5 are coils generating gradient magnetic fields in the X-, Y- and Z-directions, respectively, circular rings connected so that currents flow in the directions opposite to each other being used as the gradient magnetic field generating coil 5; 6, 7 and 8 are driving circuits for supplying currents to the gradient magnetic field generating coils $4_x$, $4_y$ and 5, respectively; 9 is a computer; 10 is a power source for the pair of electromagnets 1 generating the static magnetic field; and 11 is an instrument for measuring the volume of the object body. The intensity of the gradient magnetic fields generated by the gradient magnetic field generating coils $4_x$, $4_y$ and 5 can be varied by instructions from the instrument 11 for measuring the volume of the object body.

Now the working mode of this testing device will be explained in broad outline.

The high frequency magnetic field exciting nuclear spins in the object body 2 is generated by shaping in waveform and amplifying in electric power a high frequency power generated by a synthesizer 12 in a modulating device 13. Signals coming from the object body 2 are received by the coil 3, quadraturedetected by a detector 15 after having passed through an amplifying device 14, and inputted in a computer 9. The computer 9 displays an image corresponding to the density distribution of the nuclear spin or the relaxation time distribution on a CRT display 16 after having processed the signals. Reference numeral 17 represents a memory storing data in the course of calculations or final data. In order to realize this invention by means of such a device a sequence as indicated in FIG. 5 is used. The areas $S_1$ and $S_2$ are equal in this figure. Further a selective irradiation pulse is used for the 180° pulse, when it is combined with the multislice method.

Here the time origin is the moment where the phase rotation due to the static magnetic field, the gradient magnetic field $G_x$ in the x-direction and the gradient magnetic field $G_y$ in the y-direction is zero.

Further here 4 $T_w$ represents the period of the oscillating gradient magnetic field $G_x$. The application of this invention to the data obtained by using such a sequence is explained as follows.

At first the spin echoes are divided into groups, an even-numbered echo group and odd-numbered echo group and a 2-dimensional data array is prepared for each of them. FIG. 6 indicates the data array prepared by using the odd-numbered echoes and FIG. 7 indicates the data array prepared by using the even-numbered echoes, where $k_x$ and $k_y$ are spatial angular frequencies corresponding to the x- and y-directions and defined by $k_x = \gamma G_x T_x$ and $k_y = \gamma G_y T_y$. Here $T_x$ is the time measured from the center of the respective echo and $T_y$ the time measured from the time origin (refer to FIG. 5), as indicated in FIG. 8.

Figure 2A:
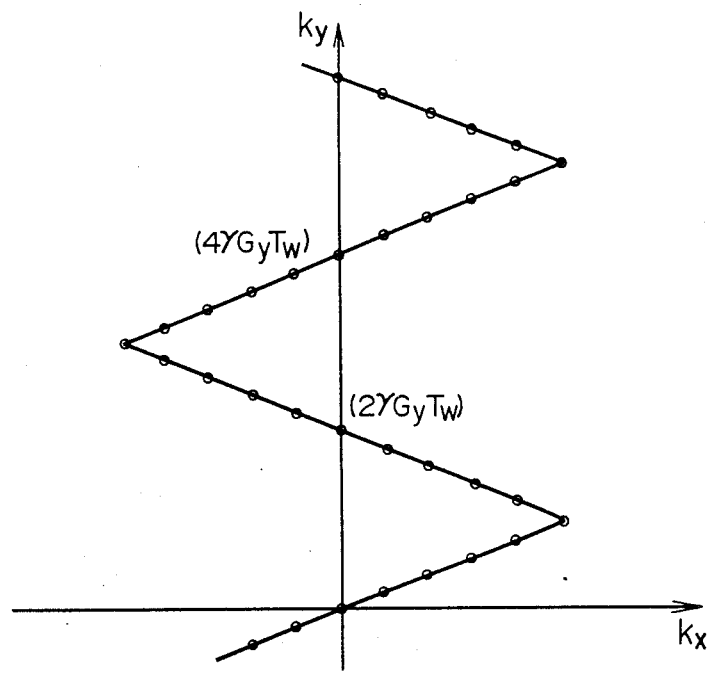
FIG. 2A indicates a trajectory in a spatial frequency domain of data points obtained by performing the prior art echo planar method.
Figure 2B:
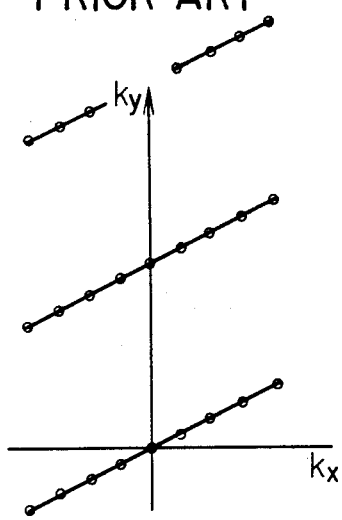
FIGS. 2B and 2C indicate trajectories of data points on the segments ascending from left to right and from right to left, respectively, in the trajectory indicated in FIG. 2A.
Figure 2C:
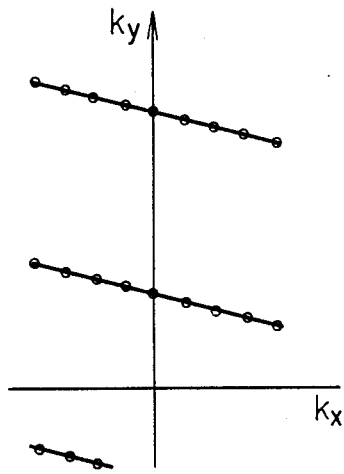
Figure 3A:
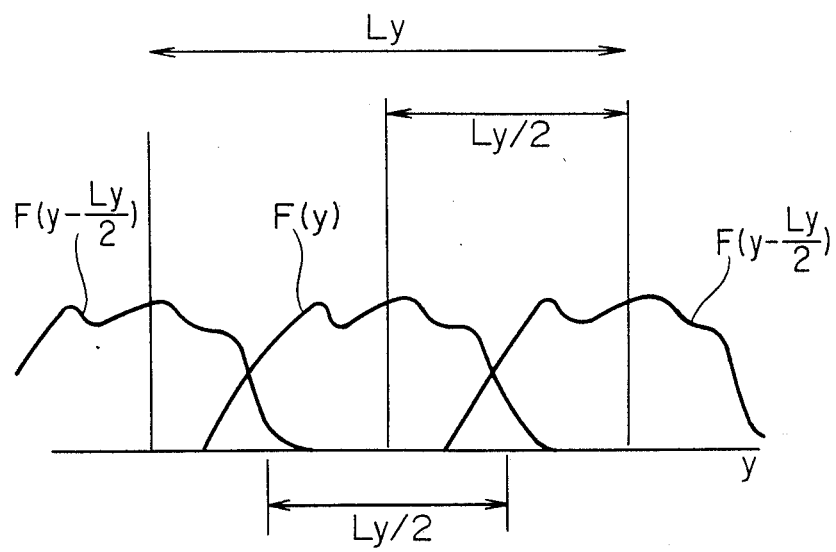
FIGS. 3A and 3B indicate a relationship among F(y), $$F\left(y + \frac{L_y}{2}\right) \text{ and } F\left(y - \frac{L_y}{2}\right)$$
Figure 3B:
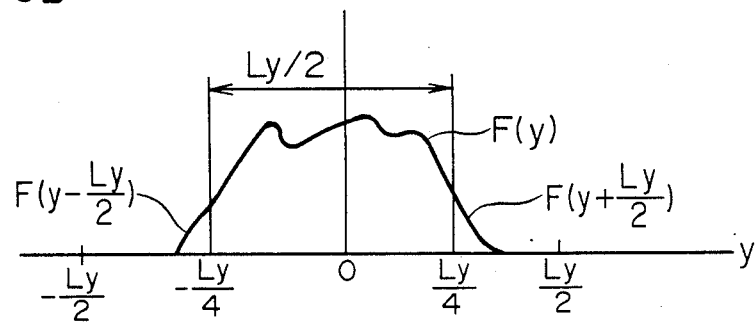

The data array obtained by using the oddnumbered echo group indicated in FIG. 6 is designated by $S_P(k_x, k_y)$ and the data array obtained by using the even-numbered echo group indicated in FIG. 7 by $S_N(k_x, k_y)$. $S_P(k_x, k_y)$ and $S_N(k_x, k_y)$ correspond to the data arrays indicated in FIGS. 2B and 2C, respectively.

Here, since $G_x$ is so set that $G_x = MG_y$ is satisfied, the smallest data interval $\Delta k_y$ in the $k_y$-direction has a value, which is twice as great as that required by the sampling theorem and a relationship $\Delta k_y = 4\pi/L_y$ is valid between the smallest data interval $\Delta k_y$ and the width $L_y$ of the field of view in the y-direction. Consequently, if $S_P(k_x, k_y)$ and $S_N(k_x, k_y)$ are Fourier-transformed with respect to $k_x$ and $k_y$ as they are, aliasing is produced in the y-direction.

This aliasing can be removed by using Eqs. (10) and (13) described above. The functions obtained by Fourier-transforming $S_P(k_x, k_y)$ and $S_N(k_x, k_y)$ with respect to $k_y$ are defined as $g_P(k_x, k_y)$ and $g_N(k_x, k_y)$, respectively. That is, $$g_P(k_x, y) = \int S_P(k_x, k_y) e^{-iyk_y} dk_y \quad (14)$$

$$g_N(k_x, y) = \int S_N(k_x, k_y) e^{-iyk_y} dk_y \quad (15)$$

Starting from these $g_P(k_x, y)$ and $g_N(k_x, y)$, aliasingfree $g(k_x, y)$, is calculated by using Eqs. (10) and (12) according to the following equations;

for $y > 0$ $$g(k_{x,y}) = \frac{-e^{-i2\pi\xi(kx)}}{1 - e^{-i2\pi\xi(kx)}} g_P(k_{x,y}) + \frac{e^{iy\eta(kx)}}{1 - e^{-i2\pi\xi(kx)}} g_N(k_{x,y}) \quad (16)$$

and for $y < 0$

-continued $$g(k_x,y) = \frac{-e^{i2\pi\xi(kx)}}{1 - e^{i2\pi\xi(kx)}} g_P(k_x,y) + \frac{e^{i y \eta(kx)}}{1 - e^{i2\pi\xi(kx)}} g_N(k_x,y) \quad (17)$$

Here, when the gradient magnetic fields are driven by rectangular currents as indicated in FIG. 5, $\eta(k_x)$ and $\epsilon(k_x)$ can be represented by;

$$\eta(k_x) = \frac{\Delta k_y}{2}\left(1 - \frac{k_x}{k_x^{max}}\right) \quad (18)$$

and $$\xi(k_x) = \frac{1}{2}\left(1 - \frac{k_x}{k_x^{max}}\right) \quad (19)$$

where $k_x^{max}$ represents the maximum value of $k_x$ and a relationship $k_x^{max} = \gamma G_x T_w$ is valid between $k_x^{max}$ and $T_w$ in FIG. 5. The image $M(x, y)$ can be reconstructed in a domain $$-\frac{L_y}{4} \leq y \leq \frac{L_y}{4}$$

by Fourier-transforming this $g(k_x, y)$ with respect to $k_x$. That is, by using $$M(x, y) = \int g(k_x, y) e^{ik_x x} dk_x \quad (20)$$

it is possible to reconstruct an aliasing-free image in $$-\frac{L_x}{2} \leq x \leq \frac{L_x}{2} \text{ and } -\frac{L_y}{4} \leq y \leq \frac{L_y}{4}.$$

On the other hand, in order to obtain an image in a domain $$\frac{L_y}{4} \leq y \leq \frac{L_y}{2} \text{ or } -\frac{L_y}{2} \leq y \leq \frac{L_y}{4}.$$

the parts concerning the aliasing are utilized. That is, in order to obtain the value in a domain $$\frac{L_y}{2} \geq y \geq \frac{L_y}{4}, F\left(y + \frac{L_y}{2}\right)$$

represented by Eq. (13) is calculated. That is, starting from $g_P(k_x, y)$ and $g_N(k_x, y)$, $k_1(k_x, y)$ is calculated by using $$h_1(k_x,y) = \frac{1}{1 - e^{i2\pi\xi(kx)}} g_P(k_x,y) - \frac{e^{i y \eta(kx)}}{1 - e^{i2\pi\xi(kx)}} g_N(k_x,y). \quad (21)$$

Now it is possible to reconstruct an image $M(x, y)$ in a domain $L_y/2 \geq y > L_y/4$ by Fourier-transforming this $h(k_x, y)$ with respect to $k_x$.

In order to obtain an image in a domain $-L_y/4 > y \geq -L_y/2$, $F(y - L_y/2)$ in Eq. (11) is utilized. That is, it is possible to calculate $h_2(k_x, y)$, using $$h_2(k_x,y) = \frac{1}{1 - e^{-i2\pi\xi(kx)}} g_P(k_x,y) - \frac{e^{i y \eta(kx)}}{1 - e^{-i2\pi\xi(kx)}} g_N(k_x,y) \quad (22)$$

instead of Eq. (21), and to obtain an image in a domain $-L_y/4 \geq y \geq -L_y/2$ by Fourier-transforming it with respect to $k_x$.

That is, gathering those described above, an image in a domain $$-\frac{L_y}{4} \leq y \leq \frac{L_y}{4}$$

can be obtained as $$M(x, y) = \int g(k_x,y) e^{-ik_x x} dk_x$$

by using Eq. (20) as it is.

An image in a domain $$\frac{L_y}{2} \geq y \geq \frac{L_y}{4}$$

can be obtained as $$M_1(x, y) = \int h_1(k_x, y) E^{-ik_x x} dk_x,$$

using $h_1(k_x, y)$ given by Eq. (21). This $M_1(x, y)$ is obtained for a domain $$-\frac{L_y}{4} \leq y \leq 0$$

and the following relationship $$M(x, y) = M_1\left(x, y - \frac{L_y}{2}\right)$$

for $\frac{L_y}{4} \leq y \leq \frac{L_y}{2}$ is set.

An image in a domain $$-\frac{L_y}{2} \leq y \leq -\frac{L_y}{4}$$

can be obtained as $$M_2(x, y) = \int h_2(k_x, y) e^{-ik_x x} dk_x,$$

using $h_2(k_x, y)$ given by Eq. (22). This $M_2(x, y)$ is obtained for a domain $0 < y \leq$ $$\frac{L_y}{4}$$

and the following relationship $$M(x, y) = M_2\left(x, y + \frac{L_y}{2}\right)$$

is set.

Figure 1A:
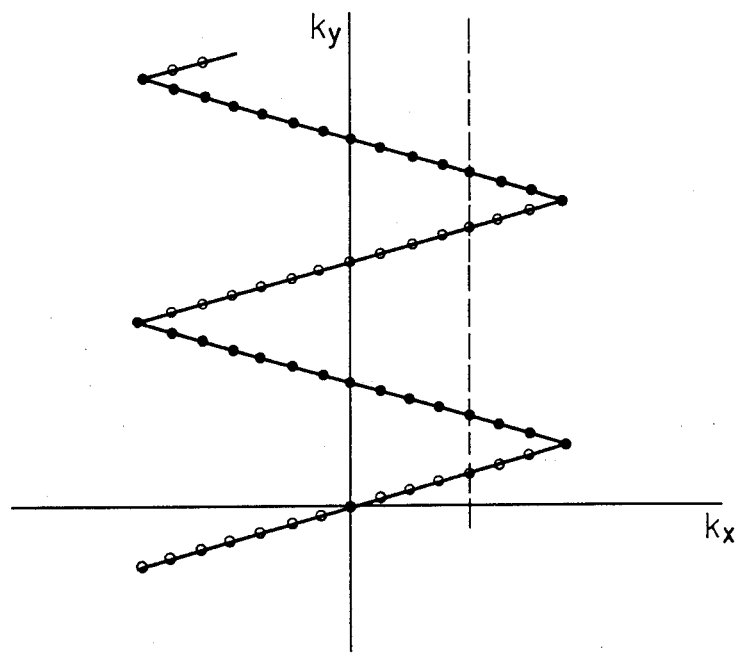
FIG. 1A indicates a trajectory in a spatial frequency domain (k-space) of data points by the echo planar method.
Figure 1B:
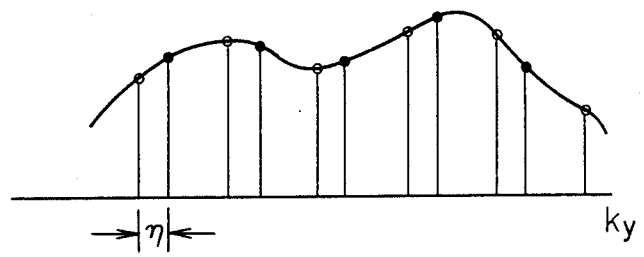
FIG. 1B indicates the signal intensity at the data points in the cross-section, where $k_x$ has a specific value, in FIG. 1A.

As indicated in FIG. 5, in the case where $G_x$ is driven by a rectangular pulse, the k-trajectory is represented by a zig-zag line as indicated in FIG. 1A and a relationship $k_x = \ominus G_x T_x$ is valid between $k_x$ in Eqs. (18) and (19) and $T_x$ in FIG. 8.

As it is well known, the echo planar method can be realized by driving the gradient magnetic field by a sinusoidal wave. In this case, assuming that the driving waveform is represented by $G_x \cos \Omega t$, $\eta(k_x)$ and $\epsilon(k_x)$ can be calculated by using $$\eta(k_x) = \frac{\Delta k_y}{2} \left[ 1 - \frac{2}{\pi} S_{in}^{-1} \left( \frac{k_x}{k_x^{max}} \right) \right] \quad (23)$$

and $$\xi(k_x) = \frac{1}{2} \left[ 1 - \frac{2}{\pi} S_{in}^{-1} \left( \frac{k_x}{k_x^{max}} \right) \right] \quad (24)$$

instead of Eqs. (18) and (19), respectively.

Although, in the above, an embodiment, in which this invention is applied to the original echo planar method, has been explained, this invention can be applied as well to the fast Fourier imaging method, which has been previously explained. FIG. 9 indicates k-trajectories of data points obtained by the fast Fourier imaging method, in the case where 3 echo trains are combined. It is clear that, according to this invention the image can be reconstructed, if $\Delta k_y = 4\pi/L_y$ is fulfilled, while, in the case where this invention is not applied, $\Delta k_y = 2\pi/L_y$ should be fulfilled, where $\Delta k_y$ indicates the interval in the $k_y$-direction between two adjacent data points represented by white circlets (or by black circlets) and $L_y$ represents the width of the field of view in the y-direction.

Further it is clear that this invention can be applied also to the high speed spectroscopic imaging method using an oscillating gradient magnetic field, which has been proposed recently ("Spatially Resolved NMR Spectroscopy Using Phase-Modulated Spin-Echo Trains" by Matsui, et al., Journal of Magnetic Resonance, Vol. 67, No. 3, pp. 476–490, (1986).

In addition, although in the above it has been assumed that the trajectory of data points in the case where the oscillating gradient magnetic field is positive (i.e. the trajectory ascending from left to right) passes through the origin in the k-space, this invention can be applied as well to the case where the trajectory of data points in the case where the oscillating gradient magnetic field is negative (i.e. the trajectory ascending from right to left) passes through the origin in the k-space. However, in this case, Eqs. (16), (17), (21) and (22) are not applied as they are, but the following equations are used instead thereof;

$$g(k_{x,y}) = \frac{-e^{\kappa 2\pi i \xi(kx)} e^{-i y \eta(kx)}}{1 - e^{\kappa 2\pi i \xi(kx)}} g_P(k_{x,y}) + \frac{1}{1 - e^{\kappa 2\pi i \xi(kx)}} g_N(k_{x,y})$$

and $$h(k_{x,y}) = \frac{-e^{-i y \eta(kx)}}{1 - e^{\kappa 2\pi i \xi(kx)}} g_P(k_{x,y}) - \frac{1}{1 - e^{\kappa 2\pi i \xi(kx)}} g_N(k_{x,y})$$

where if $y > 0, \kappa = -1$ and if $y < 0$ $\kappa = 1$.

As explained above, according to this invention, it is possible to relax measurement conditions so that the frequency of the oscillating gradient magnetic field is reduced to 50%, i.e. the period thereof is increased to twice, in measurements by the echo planar method or the fast Fourier imaging method.

The content of the specification of this application, which has been explained in the above, is reviewed in an article entitled "New Reconstruction Technique for Echo-Planar Imaging to Allow Combined Use of Odd and Even Numbered Echoes" published in Magnetic Resonance in Medicine, Vol. 5, No. 5, November 1987.

We claim:

1. An image reconstruction method in a nuclear magnetic resonance (NMR) imaging device having means for generating a static magnetic field in an inspection mode; means for generating first, second and third gradient magnetic fields for application along each of three directions perpendicular to one another in said static magnetic field; means for generating a high frequency magnetic field; means for detecting NMR signals coming from an object to be tested; a computer for effecting operations on said NMR signals; and output means for outputting the results of said operations obtained by using said computer; the method comprising the steps of:

(a) observing NMR signals while applying both of said first and second gradient magnetic fields, said first gradient magnetic field being stationary with respect to time, and said second gradient magnetic field oscillating periodically between a positive and a negative range so that a data train aligned on a zig-zag trajectory in a spatial frequency domain ($k_x$, $k_y$) is obtained, where $k_y$ is a first spatial frequency axis corresponding to a direction of the field gradient given by said first gradient magnetic field, and $k_x$ is a second spatial frequency axis corresponding to a direction of the field gradient given by said second gradient magnetic field, and that two data parts of said data train nearest to each other on a line parallel to said first axis $k_y$ and at a value of $k_x$ are spaced from each other by $\eta(k_x)$;

(b) dividing said observed NMR signal into a first data group of signals obtained during periods in which said second gradient magnetic field is positive and a second data group of signals obtained during periods in which said second gradient magnetic field is negative;

(c) Fourier-transforming each of said first group and said second group of signals with respect to the first spatial frequency axis $k_y$ to obtain each of data $g_P(k_x, y)$ for said first data group of signals and data $g_N(k_x, y)$ for said second data group of signals;

(d) multiplying a first complex number calculated from $\eta(k_x)$ to each term of the data $g_P(k_x, y)$ for each value of $k_x$;

(e) multiplying a second complex number calculated from $\eta(k_x)$ to each term the data $g_N(k_x, y)$ for each value of $k_x$;

(f) adding each term of the result of the multiplication of said step (d) to each term of the result of the multiplication of said step (e) to obtain two-dimensional data $g(k_x, y)$; and (g) Fourier-transforming the result of said addition with respect to the second spatial frequency axis $k_x$ to obtain NMR image data $M(x, y)$.

2. An image reconstruction method in NMR imaging according to claim 1, wherein said second gradient magnetic field is driven by a rectangular pulse and said first and second complex numbers include $\eta(k_x)$ calculated by using the following equation in the phase term:

$$\eta\, k_x = \frac{\Delta k_y}{2}\left(1 - \frac{k_x}{k_x^{max}}\right),$$

where $\Delta k_y = \gamma G_y (4\, T_w)$, $k_x^{max} = \gamma G_x T_w$; $G_x$ represents the amplitude of said second gradient magnetic field; $G_y$ the amplitude of said first gradien magnetic field; and $4\, T_w$ the period of said second gradient magnetic field.

3. An image reconstruction method in NMR imaging according to claim 1, wherein said second gradient magnetic field is driven by a sinusoidal wave and said first and second complex numbers include $(k_x)$ calculated by using the following equation in the phase term:

$$\eta\, k_x = \frac{\Delta k_y}{2}\left(1 - \frac{2}{\pi}\arcsin\left(\frac{k_x}{k_x^{max}}\right)\right)$$

where $\Delta k_y = \gamma G_y(4\, T_w)$, $k_x^{max} = 2/\pi\gamma G_x T_w$; $G_x$ represents the amplitude of said second gradient magnetic field; $G_y$ the amplitude of said first gradient magnetic field; and $4\, T_w$ the period of said second gradient magnetic field.

4. An image reconstruction method in NMR imaging according to claim 1, wherein said steps (d) to (f) are performed according to:

$$g(k_x, y) = \frac{-e^{i2\pi\xi(kx)}}{1 - e^{-i2\pi\xi(kx)}} g_P(k_x, y) + \frac{e^{i\gamma\eta(kx)}}{1 - e^{-i2\pi\xi(kx)}} g_N(k_x, y)$$

for $y > 0$, and $$g(k_x, y) = \frac{-e^{i2\pi\xi(kx)}}{1 - e^{i2\pi\xi(kx)}} g_P(k_x, y) + \frac{e^{i\gamma\eta(kx)}}{1 - e^{i2\pi\xi(kx)}} g_N(k_x, y)$$

for $y < 0$, where $\epsilon(k_x)$ represents a value obtained by dividing $\eta(k_x)$ by $\Delta k_y = \gamma G_y(4\, T_w)$; G the magnitude of said first gradient magnetic field; and $4\, T_w$ the period of said second gradient magnetic field.

5. An image reconstruction method in a nuclear magnetic resonance (NMR) imaging device having means for generating a static magnetic field in an inspection mode; means for generating first, second and third gradient magnetic fields for application along each of three directions perpendicular to one another in said static magnetic field; means for generating a high frequency magnetic field; means for detecting NMR signals coming from an object to be tested; a computer for effecting operations on said NMR signals; and output means for outputting the results of said operations obtained by using said computer; the method comprising the steps of:

(a) observing NMR signals while applying both of said first and second gradient magnetic fields, said first gradient magnetic field being stationary with respect to time, and said second gradient magnetic field oscillating periodically between a positive and a negative range so that a data train aligned on a zig-zag trajectory in a spatial frequency domain ($k_x$, $k_y$) is obtained, where $k_y$ is a first spatial frequency axis corresponding to a direction of the field gradient given by said first gradient magnetic field, and $k_x$ is a second spatial frequency axis corresponding to a direction of the field gradient given by said second gradient magnetic field, and that two data parts of said data train nearest to each other on a line parallel to said first axis $k_y$ and at a value of $k_x$ are spaced from each other by $\eta(k_x)$;

(b) dividing said observed NMR signal into a first data group of signals obtained during periods in which said second gradient magnetic field is positive and a second data group of signals obtained during periods in which said second gradient magnetic field is negative;

(c) Fourier-transforming each of said first group and said second group of signals with respect to the first spatial frequency axis $k_y$ to obtain each of data $g_P(k_x, y)$ for said first data group of signals and data $g_N(k_x, y)$ for said second data group of signals;

$$g(k_x, y) = \frac{-e^{i2\pi\xi(kx)}}{1 - e^{-i2\pi\xi(kx)}} g_P(k_x, y) + \frac{e^{i\gamma\eta(kx)}}{1 - e^{-i2\pi\xi(kx)}} g_N(k_x, y)$$

for $y > 0$, and $$g(k_x, y) = \frac{-e^{i2\pi\xi(kx)}}{1 - e^{i2\pi\xi(kx)}} g_P(k_x, y) + \frac{e^{i\gamma\eta(kx)}}{1 - e^{i2\pi\xi(kx)}} g_N(k_x, y)$$

for $y < 0$, where $(k_x)$ represents a value obtained by dividing $\eta(k_x)$ by $\Delta k_y = \gamma G_y (4\, T_w)$; and $G_y$ the magnitude of said first gradient magnetic field;

(e) calculating $h_1(k_x, y)$ and $h_2(k_x, y)$ according to:

$$h_1(k_x, y) = \frac{1}{1 - e^{-i2\pi\xi(kx)}} g_P(k_x, y) - \frac{e^{i\gamma\eta(kx)}}{1 - e^{i2\pi\xi(kx)}} g_N(k_x, y)$$

for $y > 0$, and $$h_2(k_x, y) = \frac{1}{1 - e^{i2\pi\xi(kx)}} g_P(k_x, y) - \frac{e^{i\gamma\eta(kx)}}{1 - e^{i2\pi\xi(kx)}} g_N(k_x, y)$$

for $y < 0$, (f) Fourier-transforming said $g(k_z, y)$, $h_1(k_x, y)$ and $h_2(k_z, y)$ with respect to said second spatial frequency axis $k_x$ to obtain NMR image data $M(x, y)$.

6. An image reconstruction method in NMR imaging according to claim 1, wherein the calculation from said step (d) to (f) are formed according to:

$$g(k_x, y) = \frac{-e^{-i2\pi\xi(kx)}\, e^{-i\gamma\eta(kx)}}{1 - e^{-i2\pi\xi(kx)}} g_P(k_x, y) +$$

$$\frac{1}{1 - e^{-i2\pi\xi(kx)}} g_N(k_x, y) \quad \text{for } y > 0$$

and

-continued $$g(k_x, y) = \frac{-e^{i2\pi\xi(kx)} e^{-iy\eta(kx)}}{1 - e^{i2\pi\xi(kx)}} g_P(k_x, y) +$$

$$\frac{1}{1 - e^{i2\pi\xi(kx)}} g_N(k_x, y) \quad \text{for } y < 0$$

where $\epsilon(k_x)$ represents a value obtained by dividing $\eta(k_x)$ by $\Delta k_y = \gamma G_y(4 T_w)$; $G_y$ the magnitude of said first gradient field; and $4 T_w$ the period of said second gradient magnetic field.

7. An image reconstruction method in a nuclear magnetic resonance (NMR) imaging device having means for generatingr a static magnetic field in an inspection mode; means for generating first, second and third gradient magnetic fields for application along each of three directions perpendicular to one another in said static magnetic field; means for generating a high frequency magnetic field; means for detecting NMR signals coming from an object to be tested; a computer for effecting operations on said NMR signals; and output means for outputting the results of said operations obtained by using said computer; the method comprising the steps of:

(a) observing NMR signals while applying both of said first and second gradient magnetic fields, said first gradient magnetic field being stationary with respect to time, and said second gradient magnetic field oscillating periodically between a positive and a negative range so that a data train aligned on a zig-zag trajectory in a spatial frequency domain $(k_x, k_y)$ is obtained, where $k_y$ is a first spatial frequency axis corresponding to a direction of the field gradient given by said first gradient magnetic field, and $k_x$ is a second spatial frequency axis corresponding to a direction of the field gradient given by said second gradient magnetic field, and that two data parts of said data train nearest to each other on a line parallel to said first axis $k_y$ and at a value of $k_x$ are spaced from each other by $\eta(k_x)$;

(b) dividing said observed NMR signal into a first data group of signals obtained during periods in which said second gradient magnetic field is positive and a second data group of signals obtained during periods in which said second gradient magnetic field is negative;

(c) Fourier-transforming each of said first group and said second group of signals with respect to the first spatial frequency axis $k_y$ to obtain each of data $g_P(k_x, y)$ for said first data group of signals and data $g_N(k_x, y)$ for said second data group of signals;

(d) according to $g(k_x, y)$ according to:

$$g(k_x, y) = \frac{-e^{-i2\pi\xi(kx)} e^{-iy\eta(kx)}}{1 - e^{-i2\pi\xi(kx)}} g_P(k_x, y) +$$

$$\frac{1}{1 - e^{-i2\pi\xi(kx)}} g_N(k_x, y) \quad \text{for } y > 0$$

and where $\epsilon(k_x)$ represents a value obtained by dividing $\eta(k_x)$ by $\Delta k_y = \gamma G_y(4 T_w)$; $G_y$ the magnitude of said first gradient magnetic field; and $4 T_w$ the period of said second gradient magnetic field;

(e) calculating $h_1(k_x, y)$ and $h_2(k_x, y)$ according to:

$$h_1(k_x, y) = \frac{e^{-y\eta(kx)}}{1 - e^{-i2\pi\xi(kx)}} g_P(k_x, y) - \frac{1}{1 - e^{-i2\pi\xi(kx)}} g_N(k_x, y)$$

for $y > 0$ and $$h_2(k_x, y) = \frac{e^{-y\eta(kx)}}{1 - e^{i2\pi\xi(kx)}} g_P(k_x, y) - \frac{1}{1 - e^{i2\pi\xi(kx)}} g_N(k_x, y)$$

for $y > 0$; and (f) Fourier-transforming said $g(k_x, y)$, $h_1(k_x, y)$ with respect to said second spatial frequency axis $k_x$ to obtain NMR image date $M(x, y)$.

* * * * *